(12) United States Patent
Matsumura et al.

(10) Patent No.: US 6,248,973 B1
(45) Date of Patent: Jun. 19, 2001

(54) LASER MARKING METHOD FOR SEMICONDUCTOR WAFER

(75) Inventors: Yukinori Matsumura; Yukihiko Sugimoto; Kotaro Hori, all of Kanagawa-ken (JP)

(73) Assignee: Komatsu Limited, Kanagawa-ken (JP)

( * ) Notice: Subject to any disclaimer, the term of this patent is extended or adjusted under 35 U.S.C. 154(b) by 0 days.

(21) Appl. No.: 09/266,264

(22) Filed: Mar. 11, 1999

(30) Foreign Application Priority Data

Mar. 11, 1998 (JP) .................................................. 10-059890

(51) Int. Cl.⁷ .................................................. B23K 26/00
(52) U.S. Cl. .................................. 219/121.69; 219/121.85
(58) Field of Search ........................... 219/121.6, 121.65, 219/121.66, 121.68, 121.69, 121.85; 427/554–556

(56) References Cited

U.S. PATENT DOCUMENTS

| | | | |
|---|---|---|---|
| 4,961,077 | * 10/1990 | Wilson et al. | 347/262 |
| 5,122,223 | * 6/1992 | Geis et al. | 117/44 |
| 5,175,774 | * 12/1992 | Truax et al. | 382/145 |
| 5,761,301 | * 6/1998 | Oshima et al. | 380/4 |
| 5,877,064 | * 3/1999 | Chang et al. | 438/401 |
| 5,942,136 | * 8/1999 | Mori et al. | 219/121.68 |
| 5,956,596 | * 9/1999 | Jang et al. | 438/401 |

* cited by examiner

Primary Examiner—Samuel M. Heinrich
(74) Attorney, Agent, or Firm—Bell, Boyd & Lloyd LLC

(57) ABSTRACT

In a laser marking method for making a dot mark on a semiconductor wafer by using laser beam, molten splashes which arise at the laser marking are prevented from adhering to a surface of the wafer and a shape of the dot mark is kept in a stable posture with its visibility being ensured even after the marking made throughout various and multistage steps in a manufacturing process by the semiconductor apparatus. The method comprises forming a transparent thin film on at least a dot mark-formation area of a semiconductor wafer body of the wafer; irradiating the dot mark-formation area with laser beam having a wavelength selected in advance, on the transparent thin film; melting and deforming the wafer body by the laser beam transmitting the transparent thin film to form a dot mark; and by utilizing the heat generated when the wafer body is melted, deforming the transparent thin film, along with the deformation of the dot mark, into the same shape as the dot mark without a breakdown of the transparent thin films.

8 Claims, 9 Drawing Sheets

LASER MARKING METHOD FOR SEMICONDUCTOR WAFER

BACKGROUND OF THE INVENTION

1. Field of the Invention

The present invention relates to a semiconductor wafer provided with a dot mark and to a method for making the dot mark. More particularly, the present invention relates to a semiconductor wafer provided with a dot mark, in which a surface of the semiconductor wafer is free from contamination which arises when the dot mark is formed using laser beam and in which the dot mark retains its form even after various steps for manufacturing the semiconductor, and the visibility is ensured throughout all steps. Further, the present invention relates to a dot marking method using laser beam.

2. Description of the Related Art

Conventionally, it has been disclosed in Japanese Patent Application Laid-Open Nos. 59-17235 and 61-95990 that in order to avoid adhesion of splashes, which are produced by the vaporization of a semiconductor wafer, to a surface of the semiconductor wafer in a laser marking step, a protective film is formed in advance on the surface of the semiconductor wafer prior to the marking and is irradiated with laser beam to form a mark on both the protective film and the surface of the semiconductor wafer.

For instance, according to the laser marking method disclosed in Japanese Patent Application Laid-Open No. 59-17235, a transmission protective film such as a silicon oxide film is formed on a whole or a part of the surface of the semiconductor wafer and is irradiated with laser beam with a high energy density from above to form a mark on the surface of the semiconductor wafer while breaking the protective film. Then, the protective film is removed. According to this marking method, the splashes in the process adheres to the surface of the protective film and the adhered splashes are removed together with the protective film. Thereafter, only simple washing is required. In Japanese Patent Application Laid-Open No. 61-95990, an organic film is used in place of the above-mentioned silicon oxide film. In this laser marking method, also, all molten splashes of the wafer produced in the marking step adhere to the resin film in the molten state. Therefore, no splashes adhere directly to the wafer, and a high quality semiconductor wafer with a dot mark can be obtained by a subsequent removal of the resin film and washing.

Meanwhile, in a process for manufacturing a semiconductor, diverse and strict manufacturing conditions must be provided in each step. In order to control these conditions, a mark of, for example, numerals, characters or bar codes is dot-displayed. Therefore, the number of the semiconductor manufacturing steps are more than 100, in addition, many process steps, such as forming elements or flattening, are performed in each step. These steps include, for example, an application of resist, reduced protuberance of a pattern on the resist, development of a resist, or flattening by various films such as insulating or metal films to fill up gaps generated by copper wiring and the like.

On the other hand, the above marking by dots is not generally finished by only one marking and the necessary minimum history data is frequently marked in each manufacturing step to know the historical characteristics in each manufacturing step. However, the marking area on the semiconductor wafer is limited to a very small range, which limits the size and number of dots to be marked. Hence the size of marking area and the size and number of dots are defined in the SEMI standard. Generally, in the marking of this type, as disclosed, for example in Japanese Patent Application Laid-Open Nos. 6-301690 and 2-299216, identification codes such as a form name, a lot name and a wafer number of the manufactured semiconductor device are marked on blank areas in the vicinity of an orientation flat section of a semiconductor wafer or in the peripheral sections of the processed surface of integrated circuits of each chip.

The semiconductor wafer dot-marked in this manner is read as a variation in reflectance by the irradiation of the beam of He—Ne laser, or a variation in the oscillation of heat wave by the ordinary laser beam. Based on the information read in this manner, various manufacturing conditions in the subsequent manufacturing steps are set. Therefore, in the case where the above reading is not made correct and incorrect information is read, all wafers will become inferior products except for casual cases. The incorrect reading is mostly caused by blurred dot marks.

Therefore, as far as the portion to be dot-marked is a processed surface of an integrated circuit as described above, there is no guarantee that easiness of reading with respect to the dot mark can be kept even in the marginal area. In particular, in the case where the area in which the dot mark is formed is in the periphery section of a semiconductor wafer, since various steps for forming films and steps for partially removing films are repeated as described above, and the periphery section of wafer is, in particular, an area where holding and releasing are repeated, it is more difficult to take care of the surface than in other sections. Also, since in forming or removing the films as described above, the dot mark is buried due to the formed film, or the depth of the mark tends to be shallowed due to an excessive removal of the film, easiness of reading is reduced every time when the wafer goes through a plurality of steps of process.

On the other hand, according to the marking method disclosed in the above publications, the protective layer is broken by laser beam in marking in order to form a dot mark on the semiconductor water under the protective layer. Although splashes produced in marking can be prevented from adhering to the water surface, the protective layer is removed from the wafer every time when the marking is carried out. Therefore, a protective film must be newly formed in the next marking and this procedure is repeated over several times. A protective film is therefore newly formed also on the mark that has been formed by the last time every time a marking step is carried out. Hence the dot mark is buried due to the protective film or scraped when each film is removed whereby the shape of the mark is greatly changed. As the steps of process go on, it becomes more difficult to read the marks formed previously.

SUMMARY OF THE INVENTION

The present invention has been made to solve such conventional problems. A first object of the present invention is to prevent molten splashes produced in laser marking, from adhering to the surface of a wafer. A second object of the present invention is to provide a semiconductor wafer in which a shape of a dot mark is always retained in a stable manner and its visibility is always ensured even after various process steps of and multi-marking steps in the process by a semiconductor device and also to provide a dot marking method. Other objects will become more apparent by the following descriptions.

The above objects can be solved by the following dot marking method of the present invention.

According to a first aspect of the present invention, there is provided a method for forming a dot mark on a semiconductor wafer by irradiation with laser beam, the method comprising: forming a transparent thin film in at least a dot-mark-formation area of a semiconductor wafer body: irradiating the dot-mark-formation area on the transparent thin film with laser beam having a wavelength selected in advance; melting and deforming the wafer body by the laser beam transmitting the transparent thin film to form a dot mark; and by utilizing heat generated when the wafer body is melted, deforming the transparent thin film into the same shape as the dot mark following the deformation of the dot mark without a breakdown of the transparent thin film.

In other words, in the present invention, a wafer body is melted and deformed in laser marking and the transparent thin film is also softened or melted by utilizing the heat of the wafer body without a breakage of the transparent film to deform the transparent film into the same shape as the mark, which is different from the conventional methods in which a protective film formed on the surface of a semiconductor wafer body is broken at the same time when a dot mark is marked by a laser marker, then the protective film is removed, thereby preventing contamination to the wafer body which is caused by molten splashes of the wafer body in the marking step.

As a result, after the transparent thin film is formed on the wafer body, the transparent thin film remains unbroken in place. The shape of the dot mark is not therefore deformed even by repeating diverse formations and removal of films in the subsequent steps for manufacturing a semiconductor. Hence the dot mark can always be read exactly and the transparent thin film also functions as the protective film like in the conventional method whereby any contamination to the wafer body caused by the splashes or the like can be also prevented.

Further, according to a second aspect of the invention, thickness of the transparent thin film is defined in a range from dozens to 20000 Å, the thickness out of the above defined range makes it impossible to form a dot mark without a breakdown of the film.

Furthermore, a third aspect of the invention includes a step, in which the surface of the transparent thin film is processed to be flattened while a coating of the transparent thin film on the surface of the dot mark is left unremoved. By this aspect, even in the case where protuberant portions of the transparent film are removed in order to perfectly remove a diverse film, which is formed on transparent thin film after laser marking, by means of etching or the like, the transparent thin film is removed with a certain thickness remained, whereby the reading of the mark in the subsequent steps can be ensured without changing the shape of the dot marks.

In fourth and fifth aspects of the invention, there are defined specific methods for deforming the transparent thin film by softening or melting without a breakdown of the transparent thin film at the same time when the dot mark is formed. A first method is a method for selecting the wavelength of the laser beam to be set at such a value that the beam is not absorbed by the transparent thin fill but absorbed by the wafer body to carry out a laser marking on the transparent thin film. A second method is a method for heating the transparent thin film in advance together with the wafer body by a proper heating means, prior to the above method and further prior to the irradiation with the laser beam. The second method is particularly suitable to the case where the thickness of the transparent thin film is large, therefore energy of the laser beam can be injected efficiently.

In a sixth aspect of the invention, there is defined a third method for deforming the transparent thin film by softening or melting without a breakdown of the transparent thin film at the same time when the dot mark is formed. The third method comprises a means for irradiating a first laser beam having such a wavelength that the laser beam is absorbed by the transparent thin film but not absorbed by the wafer body and a means for irradiating a second laser beam having such a wavelength that the beam is absorbed by the wafer body but not absorbed by the transparent thin film. According to the third method, the first laser beam is irradiated onto the dot mark-formation area to heat the transparent thin film thereby softening it in advance. Then, the second laser beam is irradiated onto the area irradiated by the first laser beam to melt and deform the wafer body and the transparent thin film in the softened state in advance is deformed by the heat generated when the wafer body is melted. Therefore, the third method is suitable for marking when the thickness of the transparent thin film is particularly large.

In seventh and eighth aspects of the invention, there are defined preferred materials for the semiconductor wafer body and transparent thin film to practice the invention according to the first aspect. The wafer body is made of a silicon wafer, which includes a case where the transparent thin film is made of a silicon oxide film, a PSG film and a BSG film and a case where the transparent thin film is made of a silicon nitride film or an alumina film.

Here, since the silicon oxide film, PSG film or BSG film is made of silicon-based glass, it is heated to such an extent that it is softened but not melted into a liquid state, whereby it is deformed into the same shape as the dot mark of the wafer body. On the other hand, since the silicon nitride film or an alumina film is made of crystal, it is suitable to a case where the transparent thin film is heated up to its melting point and deformed in the melting condition.

DETAILED DESCRIPTION OF THE PREFERRED EMBODIMENTS

Embodiments according to the present invention will be explained in detail below with reference to the drawings.

Figure 2A:
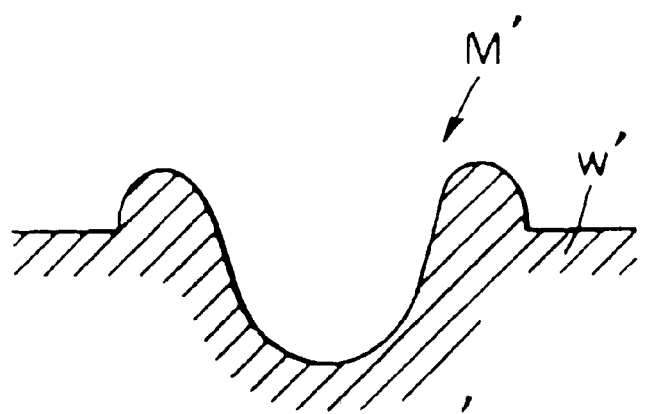
FIGS. 2A–2C are views showing a change in the shape of a dot mark resulting from the subsequent formation and removal of films which are performed on a conventional semiconductor wafer with the dot mark.
Figure 2B:
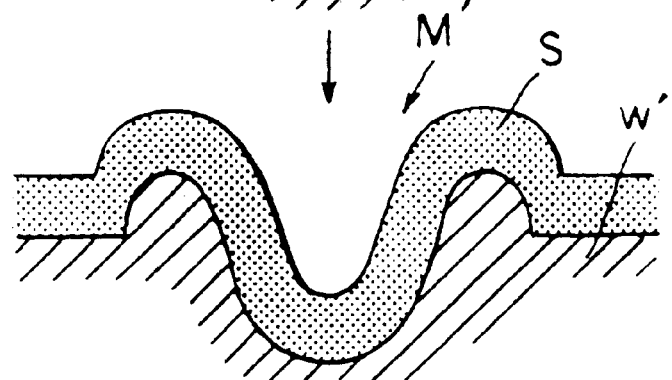
Figure 2C:
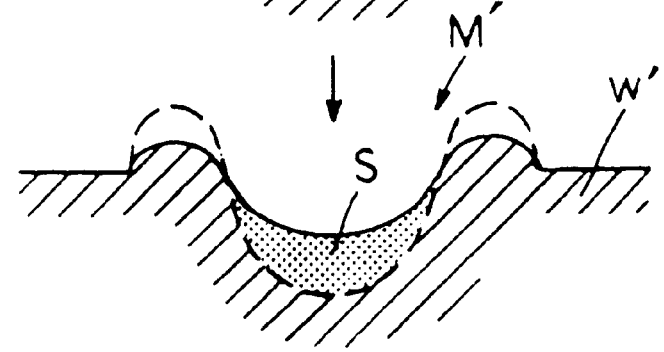

FIGS. 2A–2C show a shape of a dot mark when a film is formed on a surface of a conventional semiconductor wafer W' having a dot mark M' and a change in the shape of the dot mark M' when the film is removed.

As shown in FIG. 2A, the dot mark M' having a barnacle-like shape with a hole having a protuberant section in its periphery. The dot mark M' is directly formed on a surface of the wafer body w' by, for example, irradiating the laser beam. For instance, as shown in FIG. 2B, a diverse film S such as an insulating film or metal film is formed on the surface of the semiconductor wafer w' in which the dot mark M' is formed, thereafter the processes required for manufacturing by a semiconductor device are performed on the surface of the wafer body w', then the film S is removed by etching or the like.

At this time, in a case where the dot mark M' is formed for example, in the periphery of the semiconductor wafer W' which is under the poorest control condition, as shown in FIG. 2C, the film S is partially left unremoved in the hole of the dot mark M' or the protuberant section formed in the periphery of the dot mark is scraped, resulting in a great change in the shape of the dot mark M'. Such a change in shape makes it difficult, or sometimes impossible, to read the dot mark M'.

Figure 1A:
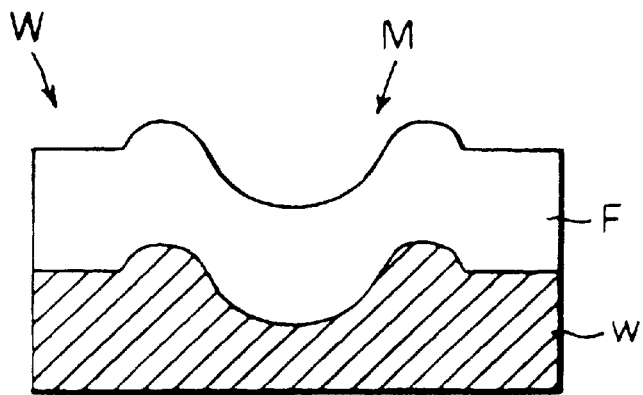
FIGS. 1A–1C are views showing a change in the shape of a dot mark resulting from the subsequent formation and removal of films which are performed on a semiconductor wafer with the dot mark formed according to the present invention.
Figure 1B:
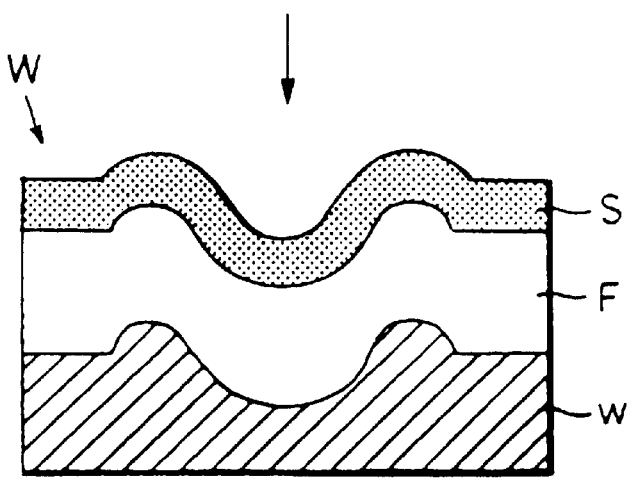

FIG. 1A shows a sectional structure of a semiconductor wafer W provided with a dot mark by irradiating laser beam on a transparent thin film F according to the marking method of the present invention. The transparent thin film F has a shape Coinciding with a shape of the mark formed on a wafer body w of the wafer W. FIG. 1B is a sectional view of the semiconductor water with a dot mark, on which another film S is further formed. FIG. 2C is a sectional view of the wafer w from which the film S has been removed.

As is understood from FIG. 2A in the semiconductor wafer W with a dot mark obtained by the method of the present invention, when the dot mark is formed on the surface of the wafer body w using a laser marker, a mark having the same shape as the dot mark is formed in the transparent thin film F without a breakage of the transparent thin film F. As the transparent thin film F, a variety of materials may be adopted. For example, a silicon oxide film, PSG film. BSG film, silicon nitride film, alumina film, polyimide film may be used.

FIGS. 3A–3D show examples of typical shapes of a dot mark formed by the dot marking method of the present invention. The mark shown in FIG. 3A has the same shape as in FIG. 2A and the shape of the mark formed on the wafer body w is not different from that of conventional marks. The size of the dot mark M having such a shape in this embodiment is between 10 and 25 $\mu$m in its processed diameter.

Figure 3A:
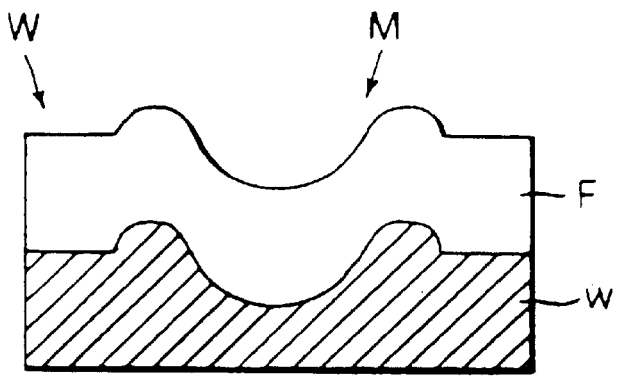
FIGS. 3A–3C are views showing typical shape examples of dot marks formed according to the present invention.
Figure 3B:
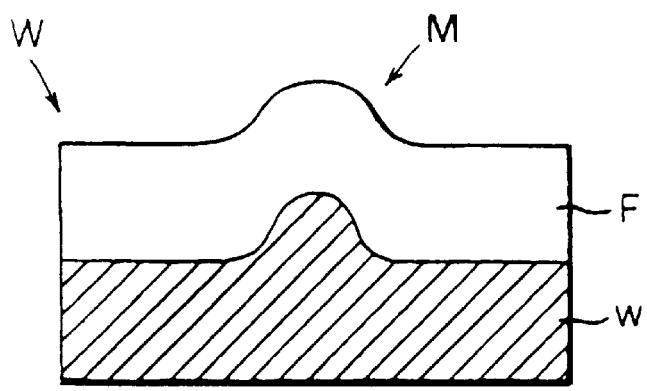

On the other hand, the shape of the dot shown in FIG. 3B, as apparently shown, exhibits a hemisphere shape projecting outward from the surface of the wafer body w. Such a shape can be made by controlling the energy of laser beam to be irradiated to be at a proper value. The formation mechanism is, though it is not clear, considered as the same phenomenon as a momentary rise in the center of a water droplet on the surface of water level, which occurs when the water droplet is dropped on the surface of water. It is considered that a center of the portion irradiated with laser beam will sink downward once and then rise and be solidified by a momentary melting of the silicon. The size of the dot mark having such a shape according to this embodiment is as extremely small as 15 $\mu$m or less in its processed diameter.

Figure 3C:
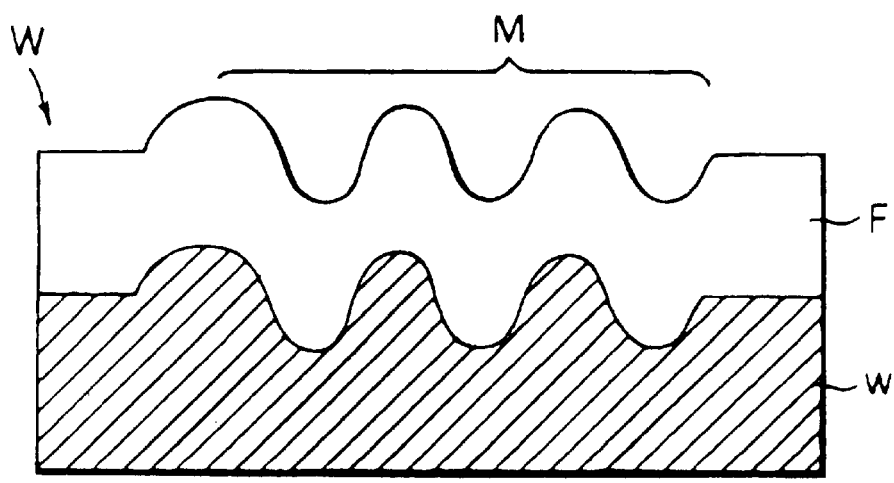

FIG. 3C shows a shape of a mark formed when the width of radiation of laser beam is made large. In this case, a plurality of uneven marks each having a ring-like shape are formed about a common center. Although the formation mechanism is not clear, this phenomenon is considered to occur, for instance, by influence of beam diffraction phenomenon. The size of the dot mark having such a shape according to this embodiment is 15 $\mu$m or more in processed diameter.

Figure 1C:
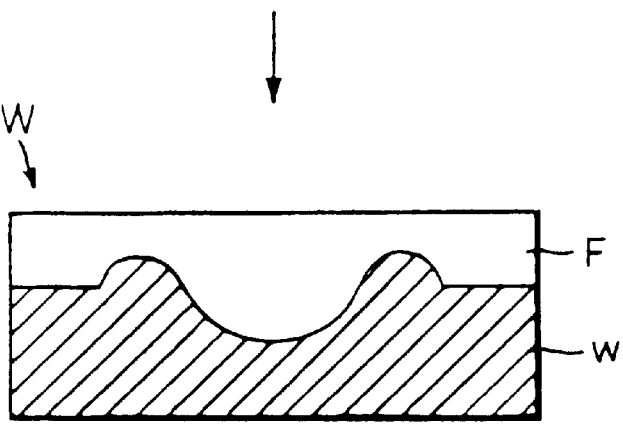

As shown in FIG. 1B, a diverse film S is formed on the semiconductor wafer W to which the dot marking method of this embodiment having the above shape is applied. The processes required for manufacturing a semiconductor are performed, and then the film S is removed by etching or the like. At this time, the sectional structure of this semiconductor wafer W according to the present invention is shown in FIG. 1C.

As is understood from the figure, even after the film S has been removed, the shape of the dot mark formed on the wafer body w can be kept as the shape at the marking. Hence the dot mark M can always be read exactly even after the film S has been removed. Moreover, even if formation and removal of the film are repeated in the subsequent multistage manufacturing steps, exact reading of the dot mark M can be ensured since the shape of the mark is not changed by allowing the transparent thin film F to remain thereon.

Next, a typical formation mechanism of a dot mark by irradiating laser beam to the semiconductor wafer W having a structure in which the aforementioned wafer body w and the transparent thin film F are laminated will be explained with respect to the semiconductor wafer W provided with the transparent thin film F of a diverse film formed on the surface of the wafer body w made of silicon monocrystal.

FIGS. 4A–4D are views typically explaining a first example of a formation mechanism of a dot mark M on the semiconductor wafer W according to the dot marking method of the present invention.

Figure 4A:
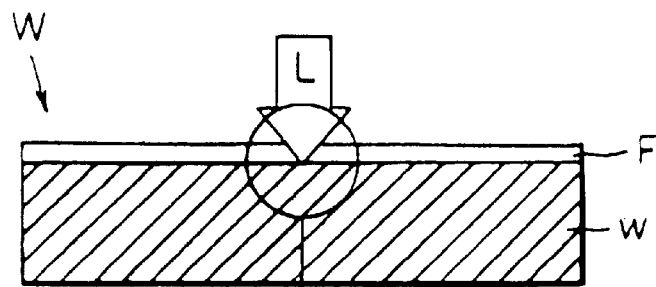
FIGS. 4A–4D are views showing a typical example of a first formation mechanism of a dot mark according to the present invention.

According to this example of a formation mechanism of a dot mark, first the transparent thin film F is formed on the surface of the wafer body w, on which the dot mark M is to be formed, as shown in FIG. 4A. Although a variety of materials may be adopted as the transparent thin film F as mentioned previously, it is of significant importance in the present invention to form the dot mark M without a breakdown of the transparent thin film F at the marking. The melting point of a silicon wafer is 1410° C. while the decomposition temperature of a polyimide, which has a higher melting point for the synthetic resin, is 800° C. Hence it is impossible to adopt polymer materials for the transparent thin film F.

In the present invention, such a transparent thin film needs to be applied that is suitable for forming the dot mark M on the wafer body w as well as the transparent thin film F by irradiating laser beam on the film F without a breakdown of the transparent thin film F after the transparent thin film F is formed on the surface of the wafer body w. Therefore, it is preferable to adopt the aforementioned silicon oxide film, PSG film, BSG film, silicon nitride film or alumina film. It is particularly preferable to adopt a silicon oxide film or alumina film which is easily formed by a CVD method and hardly broken at high temperatures. The softening point of a silicon oxide film is 1600° C., the softening points of PSG film and BSG film are close to 900° C. and the melting point of an alumina film is 2055° C.

Among the above transparent thin films, a silicon oxide film, PSG film and BSG film are made of glass, so that each of these transparent films is not liquefied at its softening point but is brought into a condition enabling a composition deformation with a large viscosity. When the semiconductor wafer W formed with the transparent thin film F on the surface of the wafer body w is irradiated with laser beam having proper energy and wavelength through the transparent thin film F, the film F exhibits viscosity even beyond the softening point. In particular, a silicon oxide film has a viscosity one million or more times of water at temperatures up to around 1600–2600° C., which can withstand the energy generated when a molten substance of the silicon wafer body scatters. Hence the film itself is prevented from scattering and it can be processed together with already melted silicon.

On the other hand, the aforementioned alumina film or silicon nitride film is melted and liquefied at its respective melting point since these are of crystal materials. Therefore, the alumina film melts at its melting point, 2055° C., and can be processed together with already melted silicon.

Thus, the dot marking area of the semiconductor wafer W provided with the transparent thin film F formed on the wafer body w is irradiated with laser beam to mark the dot mark M. At this time, it is very important to select such a wavelength that the laser bed to be irradiated is absorbed by a silicon wafer but not absorbed by the transparent thin film F.

For instance, when the materials of the transparent thin film F is a silicon oxide film, PSG film or BSG film, various lasers and each laser-beam-absorption performance of the transparent thin film by the respective wavelength are listed below.

|  | Wavelength | $SiO_2$ | PSG, BSG |
| --- | --- | --- | --- |
| $CO_{2\ laser}$ | 10.6 μm | absorbed | absorbed |
| YAG laser | 1.06 μm | transmitted | transmitted |
| YAG laser(2 ω) | 532 nm | transmitted | transmitted |
| YAG laser(3 ω) | 335 nm | transmitted | transmitted |
| YAG laser(4 ω) | 251 nm | transmitted | absorbed |
| $K_rF$ excimer laser | 248 nm | transmitted | absorbed |
| YAG laser(5 ω) | 201 nm | absorbed | absorbed |
| $K_rF$ excimer laser | 192 nm | absorbed | absorbed |

Therefore, in the present embodiment, a silicon oxide film is used as the transparent thin film F while YAG laser with a wavelength of 1.06 μm, YAG laser controlled to second harmonics or semiconductor laser or the like is used.

Figure 4B:
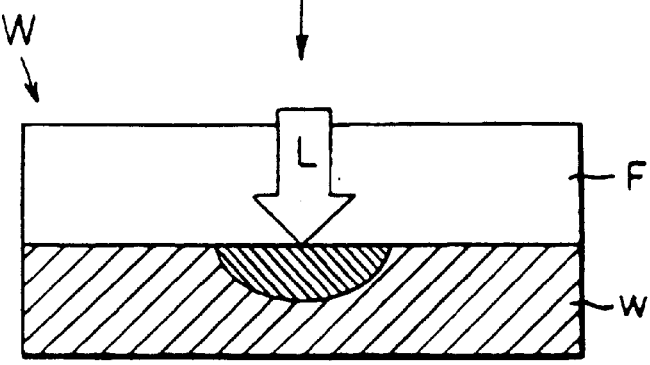
Figure 4C:
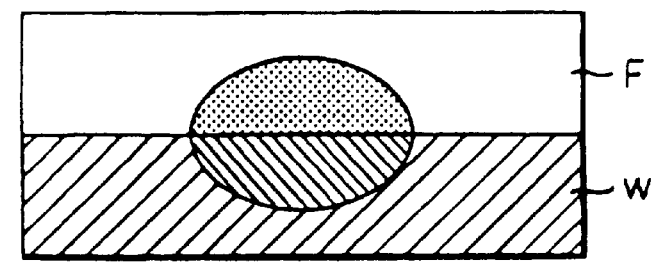
Figure 4D:
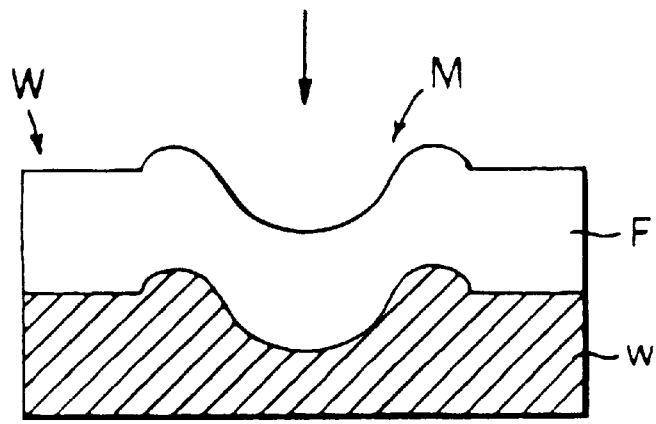

Using a laser marking apparatus with the wavelength selected in this manner, a pulse laser beam is irradiated on the transparent thin film F at a predetermined position of the dot marking area on the semiconductor wafer W having the transparent thin film F thereon as shown in FIG. 4B. By this radiation, the laser beam simply transmits the transparent thin film F and is absorbed in the surface of the silicon wafer body w. By such energy, the wafer body w generates heat and melts. At the same time when the wafer body w melts, as shown in FIG. 4C, the generated heat is transferred to the transparent thin film F to soften the transparent thin film F. The wafer body w is deformed by melting and a barnacle-shaped micro-hole having a protuberant part in its periphery is formed as described above. Since the transparent thin film F is softened when the wafer body w is deformed, it is deformed along with the deformation of the wafer body w into a shape similar to the shape of the hole without a breakdown of the film, as shown in FIG. 4D.

A processed form of the dot mark M to be processed can be varied according to a variety of factors such as laser energy, laser radiation time, the area irradiated with laser beam and the thickness and viscosity of the transparent thin film F. Accordingly, the dot mark M may be made into a form of, for instance, a hemisphere projecting outward from the surface of the wafer W instead of the barnacle-shaped hole as mentioned above. When the irradiated energy of laser beam is excessively large, the vapor pressure of the silicon wafer body w becomes excessively high so that it breaks the transparent thin film F whereby the molten silicon scatters externally. Further, when the irradiated energy of laser beam is excessively small, the marking processing is not achieved at all. Further, it has been clarified that the irradiated energy of laser beam has a relationship with a pulse width of the laser beam. However, in the practice of the dot marking method of the present invention with respect to the semiconductor wafer W having the transparent thin film F thereon, the energy of laser beam to be irradiated cannot be determined only by the pulse width but is also affected by material or thickness of the transparent thin film F.

Therefore, the processing condition of the dot marking for the semiconductor wafer W of the present invention is determined primarily by the pulse width of the irradiated laser beam and the thickness of the transparent thin film F.

Figure 5:
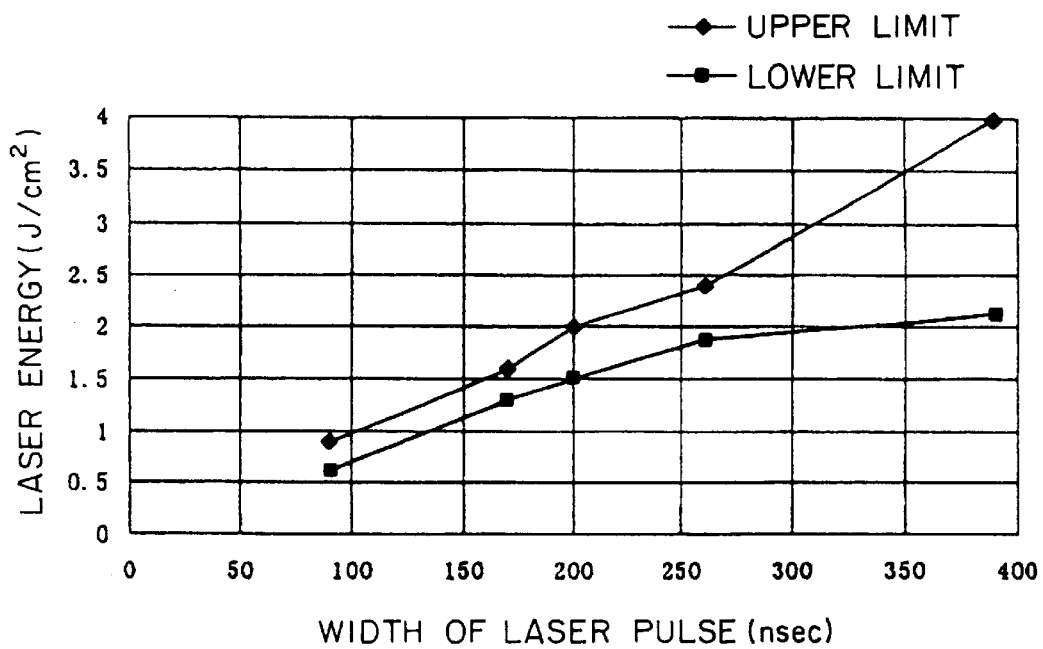
FIG. 5 is a graph for explaining the upper and lower limits between which a transparent thin film is not broken, and a correlation between the laser energy capable of processing and the width of a laser pulse.

FIG. 5 shows the upper and lower limits of the energy between which a desired dot mark can be formed on the surface of the silicon wafer body w without a breakdown of a silicon oxide film and the relationship between laser energy and the width of a laser pulse, when the silicon oxide film is used as the transparent thin film F. The upper limit indicates a value of energy above which the transparent thin film F will be broken whereas the lower limit indicates a value below which the marking M cannot be formed on the silicon wafer body w.

As is understood also from FIG. 5, the energy of laser beam with respect to the semiconductor wafer W increases proportionally as the pulse width of the laser beam increases. However, the difference between the upper and lower limits increases as the pulse width increases. It is considered that this is because the extension of the pulse width renders a variation in the temperature of silicon gentle and hence the process of melting and deformation of the silicon and silicon oxide film goes slowly whereby any shocking power can hardly be applied so that the silicon oxide film can withstand laser beam with a high energy. In this embodiment, in order to securely prevent the breakdown of the transparent thin film thereby carrying out marking in stable manner, the marking is made at a pulse width with a range from 90 to 400 nsec. The same thought can be applied to a case where the pulse width is even out of the above defined range as far as the pulse width is in a range from 10 nsec at least.

Figure 6:
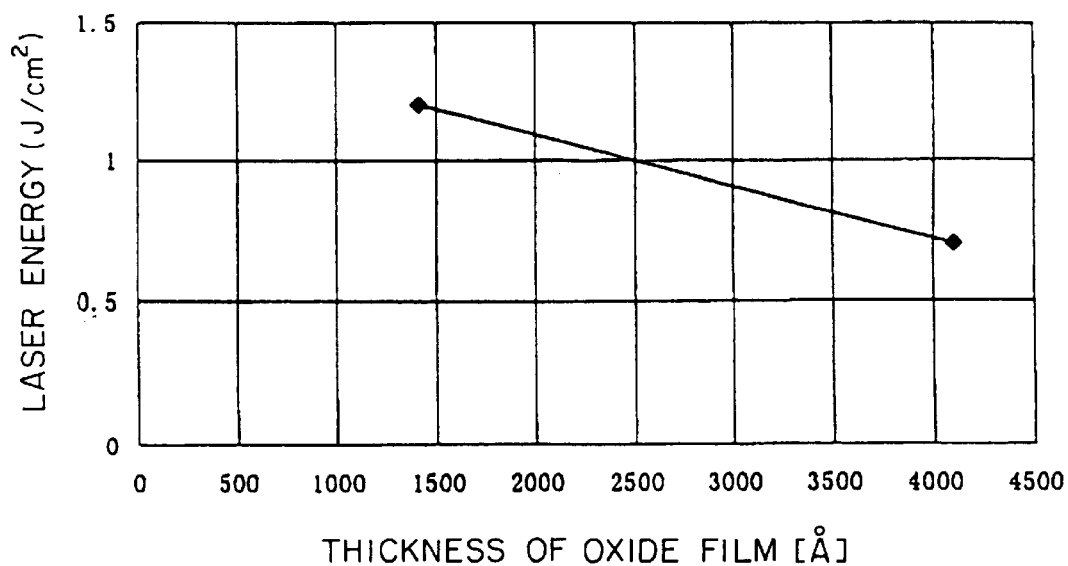
FIG. 6 is a graph for explaining a correlation between the thickness of a transparent thin film capable of being processed without a breakdown of the transparent thin film, and the laser energy.

FIG. 6 shows a relationship between the upper limit of thickness of the transparent thin film F below which the transparent thin film F is not broken and the energy of laser beam to be irradiated when the dot marking of the present invention is carried out using a silicon oxide film as the transparent thin film F by laser beam with a pulse width of 90 nm. In this embodiment, the energy of the laser beam to be irradiated is controlled by adjusting the strength of beam by increasing and decreasing laser beam emitted from a laser oscillator through an extinction filter (not shown). When the pulse width of the laser is 90 to 100 nsec in FIG. 5, the thickness of the transparent thin film F is substantially 2500 Å which corresponds to a laser energy of about 1 (J/cm$^2$) in FIG. 6.

According to FIG. 6, in the marking performed according to the laser marking method of the present invention, when the pulse width of laser is set at 90 nsec, this embodiment ensures that when the laser energy is in a range of at least 1.2 to 0.7 (J/cm$^2$), the silicon oxide film (the transparent film F) can be processed without any breakdown if the thickness of the silicon oxide film is in a range from 1400 to 4100 Å. Further, the thickness of the film decreases linearly at a negative gradient along with the decrease in the laser energy. Even in the case where the thickness is equal to or less than 1400 Å, or equal to or greater than 4100 Å, the laser energy does not vary linearly at the same gradient with respect to a variation in the thickness enabling the processing wherein the film is not broken. When the thickness of the film is out of the range from 1400 to 4100Å, the laser energy of 1.2 (J/cm$^2$) or 0.7 (J/cm$^2$) enables the processing to be achieved.

Such a relationship between the thickness of the transparent thin film F and the laser energy in the condition that the transparent thin film is not broken may be considered as follows. As the thickness of the film is small, the rate of the heat from the silicon wafer body w to the transparent thin film F can be rapidly transferred and the rate of uniformity of the heat distribution of the transparent thin film F is rapid. Because of this, the entire transparent thin film F tends to melt and be softened in the direction of the thickness and is not broken even by a large laser energy. On the other hand, when the thickness of the transparent thin film F is large, the heat is not transferred rapidly in the direction of the thickness. Because of this, the heat distribution in the side of the wafer body is different from that in the ambient side, bringing about a difference in expansion between the both sides, whereby the transparent thin film F which is highly brittle by such difference in expansion is easily ruptured instantly.

As mentioned above, in manufacturing a semiconductor, formation and removal of various films on the surface of the semiconductor wafer W are repeated in multistage processes and at the same time, various management dot markings are carried out using laser beam in multistage processes. In such a case, if a variation in the thickness of the transparent thin film F is detected and the energy of laser beam to be irradiated is controlled according to the thickness of the film in the marking step, a final dot marking can be performed without a breakdown of the transparent thin film F formed once. This ensures that the shape of the dot mark M formed previously is kept throughout the process for manufacturing the semiconductor and the accuracy in the detection of the dot mark M is also guaranteed to the end of the process.

Figure 7A:
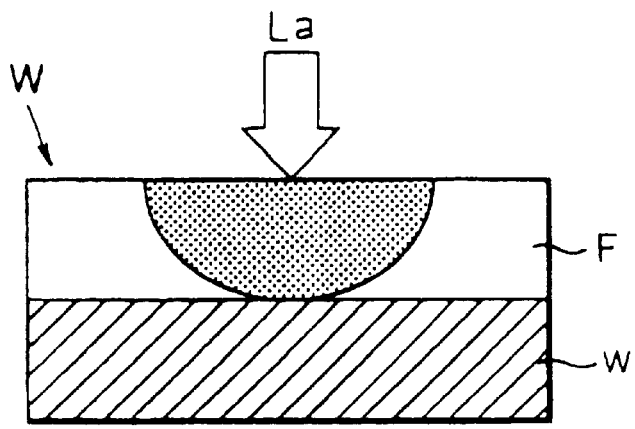
FIGS. 7A–7D are views showing a typical example of a second formation mechanism of a dot mark according to the present invention.
Figure 7B:
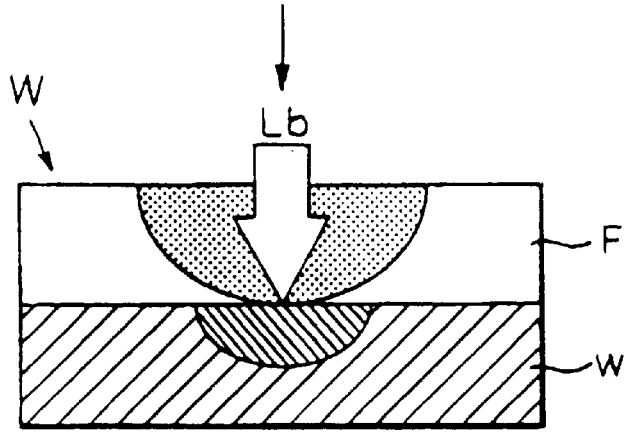
Figure 7C:
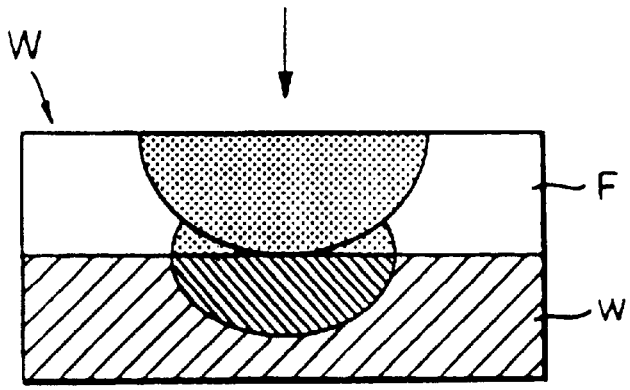

FIGS. 7A–7D show another example of a formation mechanism of a dot mark M according to the present invention. This example of the formation mechanism of a dot mark is a method suitable, particularly, for a case where the thickness of the transparent thin film F is large. Firstly, as shown in FIG. 7A, a first laser beam La which is not absorbed by the wafer body w but absorbed only by the transparent thin film F is selected. The first laser beam La is irradiated to heat the transparent thin film F in advance thereby softening it. Next, as shown in FIG. 7B a second laser beam Lb which is absorbed by the wafer body w but not absorbed by the transparent thin film F is selected. The second laser beam Lb is irradiated on the transparent thin film F so that only the wafer body w absorbs the laser beam Lb to generate heat.

Figure 7D:
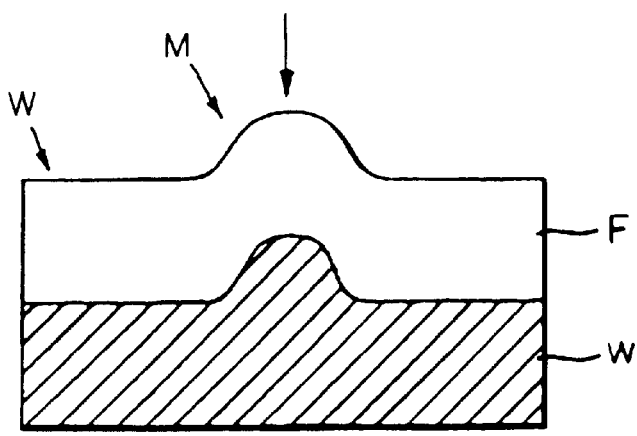

In such two-stage irradiation with the first laser beam La and the second laser beam Lb, the first laser beam La softens the transparent thin film F and the second laser beam Lb causes the wafer body w to generate heat, which also softens the transparent thin film F whereby the transparent thin film F is deformed with ease. As a result, as shown in FIG. 7D, the transparent thin film F is deformed rapidly along with the deformation of the wafer body w, therefore a dot mark M coated with the transparent thin film F is formed. This example shows the dot mark M having a hemisphere shape projecting outward from the surface of the semiconductor wafer W.

Figure 8:
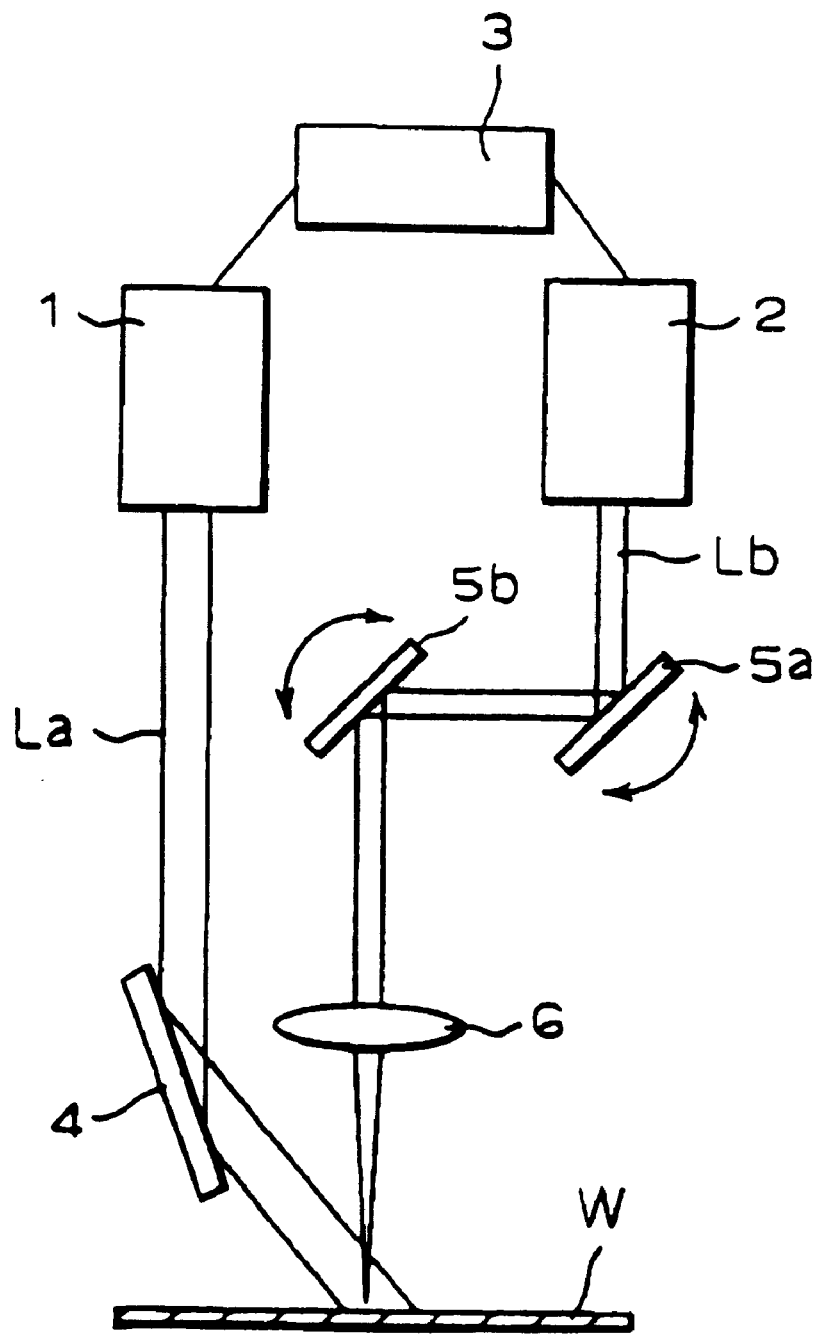
FIG. 8 is a view showing a typical example of a laser dot-marking apparatus used to practice the example of the above-mentioned formation mechanism of a dot mark.

FIG. 8 shows an embodiment of a laser marking apparatus suitable for the practice of the dot marking mentioned above. In this example, the above first and second laser beams are separately emitted from independent two laser sources. In other words, the laser beam La emitted from the first laser source 1 is reflected by a reflecting mirror 4 to irradiate around the marking area including the mark-formation point. At this time, the wavelength and a timing of irradiation of the laser beam La are controlled by a controller 3. The irradiation from the first laser source 1 is stopped at the time when the transparent thin film F is softened, and at the same time, the irradiation from the second laser source 2 is started to melt and deform the wafer body w via reflecting mirrors 5a, 5b and a condensing lens 6, and also deforming the transparent thin film F.

Figure 9:
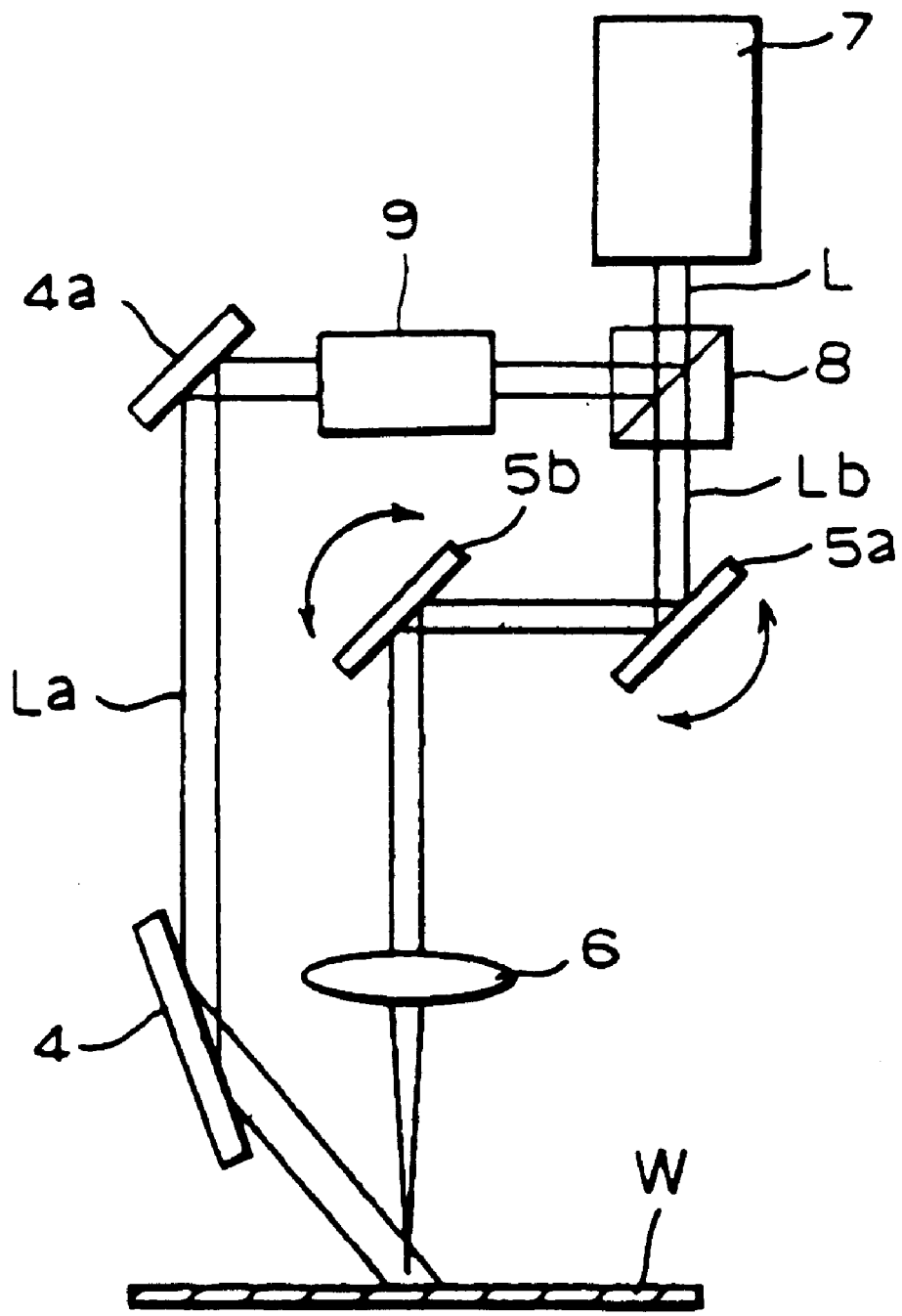
FIG. 9 is a view showing a typical example of another laser dot-marking apparatus used to practice the example of the mechanism of the formation of a dot mark.

FIG. 9 shows an example of a laser marking apparatus which irradiates the above two-stage laser beams La, Lb by using a single laser source 7. According to this apparatus, laser beam emitted from the single laser source 7 is branched out into two optical paths through a half mirror 8. The laser beam on one optical path is converted into such a wavelength that the beam is not absorbed by the wafer body w but absorbed by the transparent thin film F through a wavelength conversion element 9 and is irradiated around the marking area including the mark-formation point by using a reflecting mirror in the same manner as mentioned above. The other laser beam branched by the half mirror 8 has, by nature, such a wavelength that the beam is absorbed by the wafer body w but not absorbed by the transparent thin film F. Similarly to the above example, the laser beam Lb transmitted from the half mirror 8 is irradiated to the wafer body w via the reflecting mirrors 5a, 5b and the condensing lens 6, thereby melting and deforming the wafer body w and also deforming the transparent thin film F.

Figure 10A:
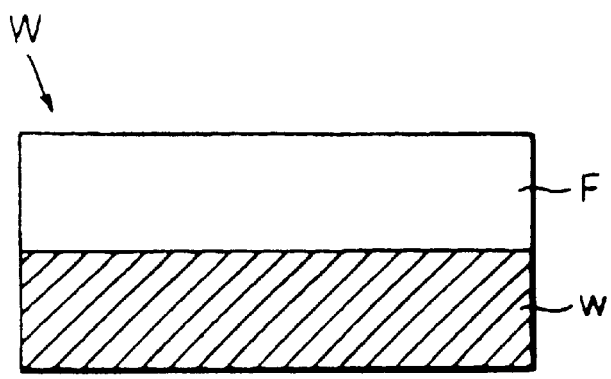
FIGS. 10A–10D are views showing a typical example of a third mechanism of the formation of a dot mark according to the present invention.
Figure 10B:
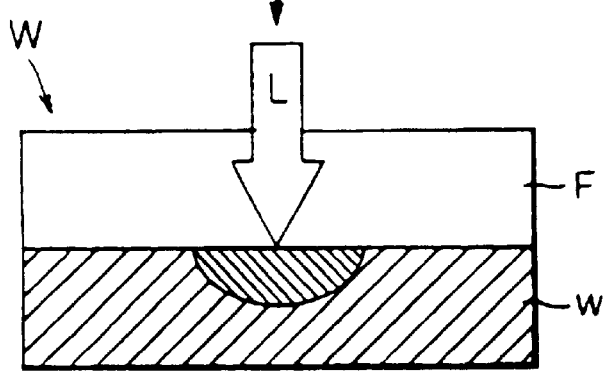
Figure 10C:
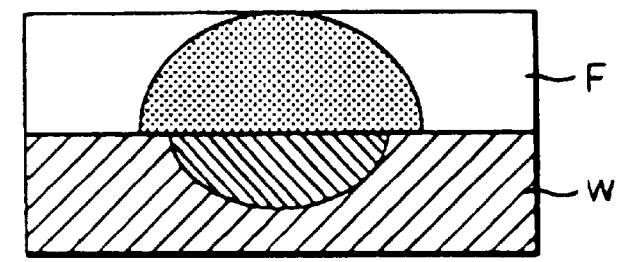
Figure 10D:
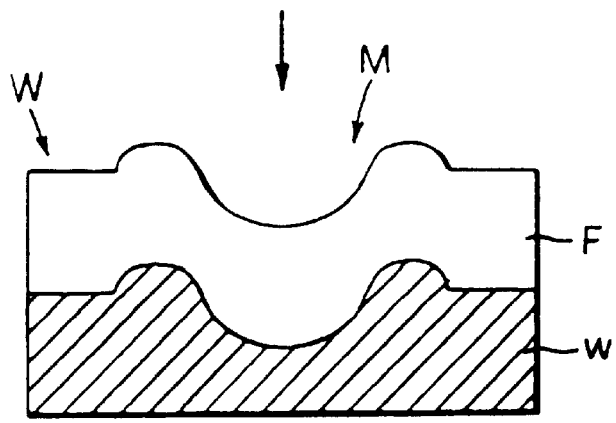

FIGS. 10A–10D shows an example in which two-stage heating is carried out to form a dot mark in the same manner as in the above example of the formation mechanism of a dot mark. In this example of the mechanism, as shown in FIG. 10A, firstly, the transparent thin film F and the wafer body w are heated and raised in temperature in advance at the same time. In other words, in this example of the mechanism, first the entire semiconductor wafer W is preheated, for instance, in a furnace. Next, as shown in FIG. 10B, the laser beam with such a wavelength that the beam is not absorbed by the transparent thin film F but absorbed by the wafer body w is irradiated on the transparent thin film F in the same manner as in the above first example of the formation of a dot mark, thereby allowing only the wafer body w to absorb the laser beam as shown in FIG. 10B. The heat generated at that time is utilized to soften the transparent thin film F as shown in FIG. 10C and at the same time to melt and deform the wafer body w itself thereby deforming the transparent thin film F to form the dot mark M having the shape shown in FIG. 10D.

What is claimed is:

1. A laser marking method for forming a dot mark on a semiconductor wafer by irradiation of laser beam, the method comprising:
   (a) forming a transparent thin film on at least a dot mark-formation area of a semiconductor wafer body of the semiconductor wafer;
   (b) irradiating the dot mark-formation area with laser beam having a wavelength selected in advance, on the transparent thin film;
   (c) melting and deforming the wafer body by the laser beam transmitting the transparent thin film to form a dot mark; and
   (d) by utilizing the heat generated when the wafer body is melted, deforming the transparent thin film, along with the deformation of the dot mark, into the same shape as the dot mark without a breakdown of the transparent thin film.

2. A laser marking method according to claim 1, wherein thickness of the transparent thin film is in a range from dozens to 20000 Å.

3. A laser marking method according to claim 1, wherein a surface of the transparent thin film is processed to be flattened while a coating of the transparent thin film on a surface of the dot mark is left unremoved.

4. A laser marking method according to claim 1 or 2, wherein the wavelength of the laser beam is selected to such a value that the beam is not absorbed by the transparent thin film but absorbed by the wafer body.

5. A laser marking method according to claim 4, wherein the transparent thin film as well as the wafer body are heated in advance prior to the irradiation with the laser beam.

6. A laser marking method according to claim 1 or 2, comprising a means of irradiating a first laser beam having such a wavelength that the laser beam is absorbed by the transparent thin film but not absorbed by the wafer body and a means of irradiating a second laser beam having such a wavelength that the laser beam is absorbed by the wafer body but not absorbed by the transparent thin film, wherein
   the first laser beam is irradiated onto the dot mark-formation area to heat the transparent thin film thereby softening it in advance;
   the second laser beam is then irradiated onto the area irradiated with the first laser beam to melt and deform the wafer body; and
   the transparent thin film softened in advance is deformed by the heat generated when the wafer body is melted.

7. A laser marking method according to claim 1 or 2, wherein the semiconductor wafer body is made of silicon and the transparent thin film is made of a silicon oxide film, a PSG film or a BSG film.

8. A laser marking method according to claim 1 or 2, wherein the semiconductor wafer body is made of silicon and the transparent thin film is made of a silicon nitride film or an alumina film.

* * * * *